United States Patent [19]
Maeda et al.

[11] Patent Number: 5,876,884
[45] Date of Patent: Mar. 2, 1999

[54] METHOD OF FABRICATING A FLAT-PANEL DISPLAY DEVICE AND AN APPARATUS THEREFORE

[75] Inventors: Ryuji Maeda; Mitsugu Uemura; Masahiro Uraguchi, all of Kawasaki, Japan

[73] Assignee: Fujitsu Limited, Kawasaki, Japan

[21] Appl. No.: 942,728

[22] Filed: Oct. 2, 1997

[51] Int. Cl.⁶ .................................. G03B 7/62; G03F 9/00
[52] U.S. Cl. .............................. 430/22; 430/394; 430/30; 430/23; 396/546; 355/75; 355/77; 356/401
[58] Field of Search ...................... 430/5, 22, 30, 430/23, 945, 394; 396/546, 547; 355/75, 77; 356/401

[56] References Cited

U.S. PATENT DOCUMENTS 5,552,892  9/1996  Nagayama ........................ 356/401

FOREIGN PATENT DOCUMENTS

2-130910  5/1990  Japan ........................ 356/401

*Primary Examiner*—Martin Angebranndt
*Attorney, Agent, or Firm*—Staas & Halsey

[57] ABSTRACT

An exposure process of a pattern on a transparent substrate of a plasma display panel is conducted on a flat principal surface of stage in which a depression is formed for accommodating an alignment optical source, wherein a movable shutter is provided on the stage so as to be movable in a plane substantially flush to the principal surface of the stage.

8 Claims, 9 Drawing Sheets

SHUTTER CLOSE

SHUTTER CLOSE OR OPEN

METHOD OF FABRICATING A FLAT-PANEL DISPLAY DEVICE AND AN APPARATUS THEREFORE

BACKGROUND OF THE INVENTION

The present invention generally relates to flat-panel display devices and, more particularly, to fabrication of a so-called plasma display panel.

Plasma display panels (PDP) are used in various information display apparatuses, including a wide-screen TV set, as a thin information display device having a very large display area.

Figure 1:
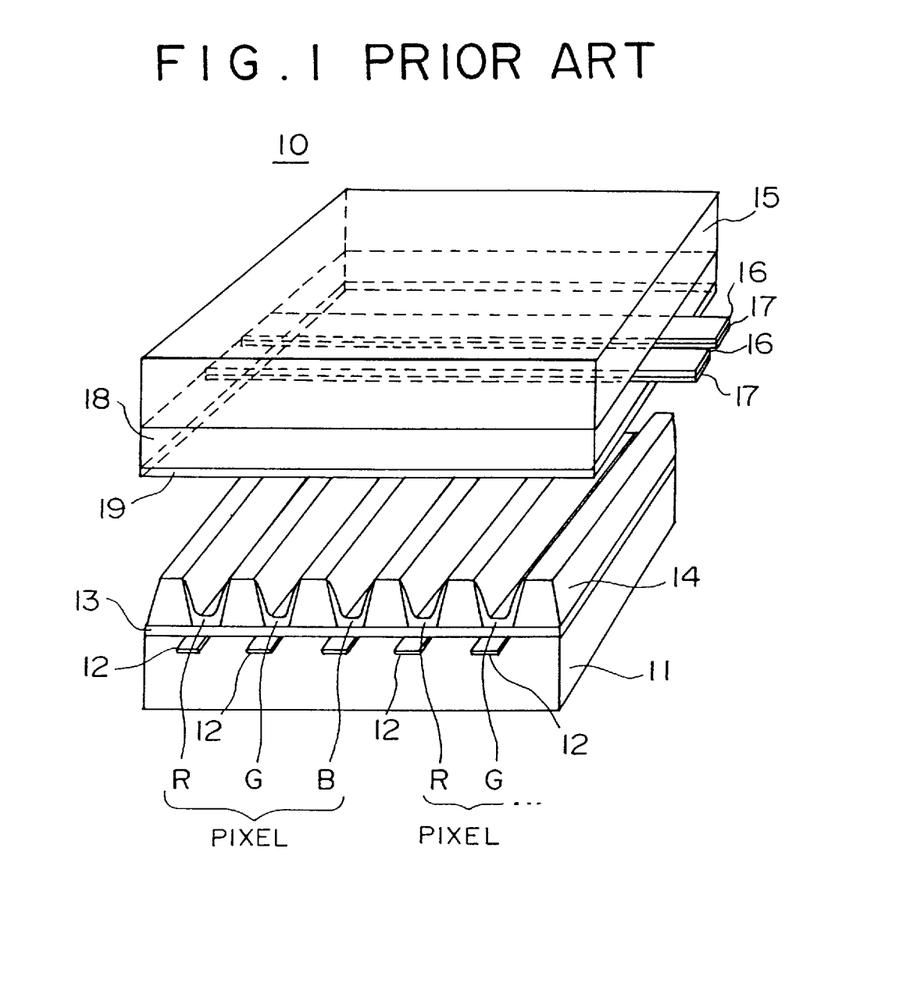
FIG. 1 is a diagram showing the construction of a conventional plasma display panel.

FIG. 1 shows the construction of a conventional PDP 10 of the so-called AC type.

Referring to FIG. 1, the PDP 10 includes a rear glass substrate 11 and a front glass substrate 15, wherein the rear glass substrate 11 carries thereon a number of address electrodes 12 each formed of a metal such as Cr, such that each of the address electrodes 12 extends in a column direction on the substrate 11. The glass substrate 1 further carries thereon a dielectric layer 13 of a low melting glass such that the dielectric layer 13 covers the foregoing address electrodes 12. The dielectric layer 13 in turn carries thereon a number of rib patterns 14 each formed of a low melting glass and extending in the column direction, wherein a pair of the rib patterns 14 are disposed at both, i.e., the opposite, lateral sides of an address electrode 12. Further, a fluorescent substance corresponding to one of the three primary colors red (R), green (G) and blue (B) is provided between a pair of the rib patterns 14 in association with the corresponding address electrode 12.

The front glass substrate 15 carries thereon a number of mutually parallel display electrodes 16 of a transparent conductive material such as ITO ($In_2O_3 \cdot SnO_2$), such that each of the display electrodes 16 extends in a row direction on the glass substrate 15. In the present description, the row direction is defined as being perpendicular to the foregoing column direction.

Each of the display electrodes 16 carries thereon a bus electrode 17 of a metal such as Cr, such that the bus electrode 17 extends on the display electrode in the row direction with a reduced width as compared with the display electrode 16. Further, the glass substrate 15 is covered by a dielectric layer 18 of a low melting glass such that the dielectric layer 18 covers the display electrodes 16 and the bus electrode 17 thereon. Further, a protective film 19 of MgO is provided on the dielectric layer 18.

The glass substrates 11 and 15 are assembled as indicated in FIG. 1 such that the rib patterns 14 on the glass substrate 11 face the protective film 19 on the glass substrate 15. Further, the gap between the substrate 11 and the substrate 15 is filled by a gas such as He, Ne or Xe.

In operation, a drive voltage signal is applied between a selected address electrode 12 and a selected display electrode 17, and a gas plasma is formed in correspondence to the intersection of the foregoing selected electrodes. The gas plasma thus formed causes an optical excitation in the fluorescent substance on the substrate 11 covering the region corresponding to the foregoing intersection.

When fabricating the PDP 10, it is necessary to form the rib patterns 14 on the transparent glass substrate 11 after formation of the address electrodes 12 by conducting a photolithographic process. Similarly, it is necessary to form the bus electrodes 17 on the display electrodes 16 after the formation of the display electrodes 16. When a pattern is to be formed on another pattern by a photolithographic process, it is necessary to carry out an alignment process such that the upper pattern is aligned properly with the lower pattern. In relation to this, it should be noted that the rib patterns 14, formed of a low melting glass, have a whitish, opaque structure.

Figure 2:
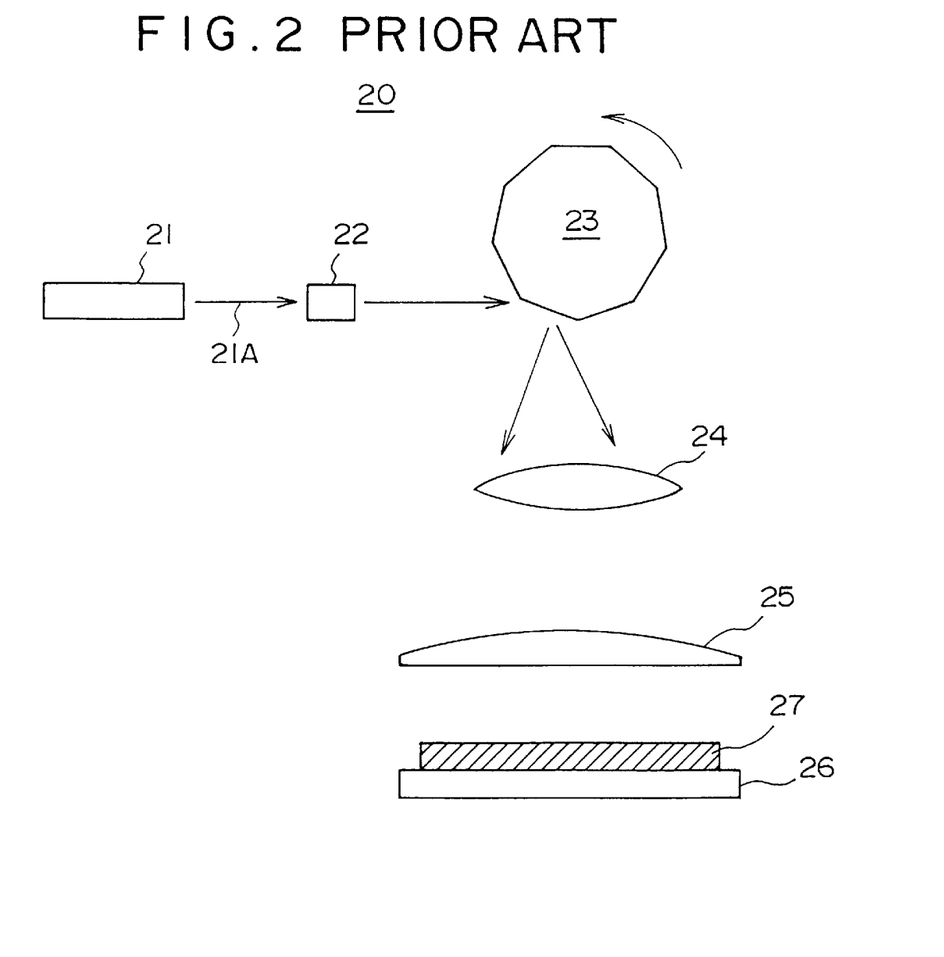
FIG. 2 is a diagram showing the construction of an exposure system used for the fabrication of the plasma display panel of FIG. 1.

FIG. 2 shows the construction of an exposure system 20 used in the foregoing photolithographic patterning process when fabricating the PDP apparatus 10 of FIG. 1.

Referring to FIG. 2, the exposure system 20, which includes an Ar laser 21 and an acoustic-optical modulator (AOM) 22 modulating a laser beam 21A emitted by the Ar laser 21, wherein the laser beam 21A thus modulated by the AOM 22 is deflected by a rotary polygonal mirror 23 and scans over the surface of a substrate 27 held on a stage 26, after passing through a lens 24 and a condenser lens 25 consecutively. The substrate 27 may either be the substrate 11 or substrate 15.

Figure 3:
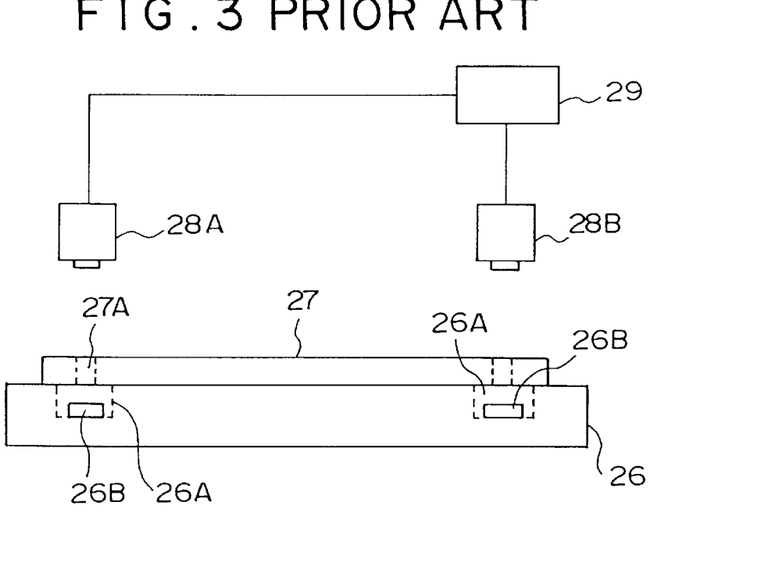
FIG. 3 is a diagram showing the construction of an alignment apparatus used in the exposure system of FIG. 2.

FIG. 3 shows the construction of an alignment apparatus used in the exposure system 20 for aligning an upper pattern to a lower pattern.

Referring to FIG. 3, the alignment of the upper pattern to the lower pattern is achieved in the apparatus of FIG. 3 by using an alignment mark as usual in a photolithographic process, and the apparatus of FIG. 3 includes CCD cameras 28A and 28B as well as an image processor 29 cooperating with the cameras 28A and 28B for detection of the alignment mark. In the construction of FIG. 3, it should be noted that the LEDs 26B in respective depressions 26A produce the output optical beams with a wavelength different from the wavelength of the exposure laser beam 21A. Thereby, the output optical beam of the LED 26A or 26B causes no substantial exposure of the photoresist 14A (see FIG. 4B). For example, the LED 26A or 26B may produce a red color beam.

Figure 4A:
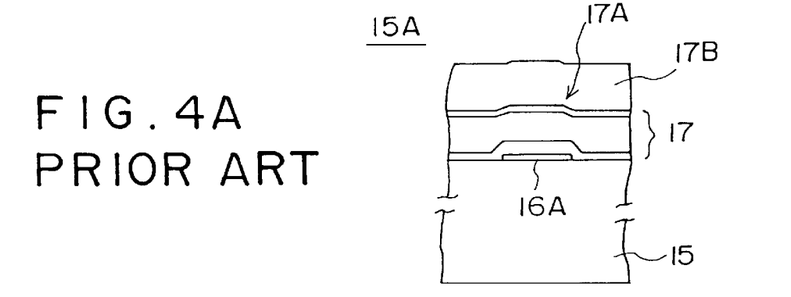
FIGS. 4A and 4B are diagrams showing examples of the alignment mark used in the fabrication of the plasma display panel of FIG. 1.
Figure 4B:
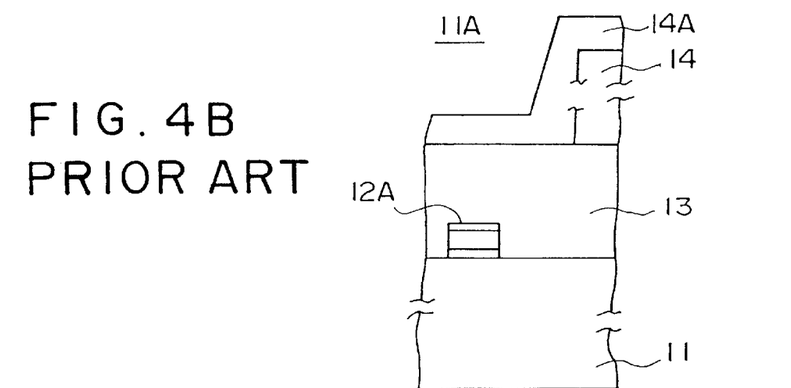

FIGS. 4A and 4B show the cross sectional structure of alignment marks 15A and 11A provided respectively on the substrate 15 and the substrate 11 for the foregoing alignment.

Referring to FIG. 4A, the alignment mark 15A includes an ITO pattern 16A provided on the substrate 15 at a predetermined location, wherein the ITO pattern 16A is covered by a Cr electrode layer forming the bus electrode 17. Thus, the Cr layer is designated by the same reference numeral 17 in FIG. 4A.

In the construction of FIG. 3, the CCD cameras 28A and 28B are used to detect a projection 17A formed on the surface of the Cr layer 17 in correspondence to the ITO pattern 16A as the alignment mark 15A. It should be noted that the Cr layer 17 has actually a Cr/Cu/Cr structure in which a pair of Cr layers sandwich a Cu layer and exhibits a very high reflectance. In FIG. 4A, it should be noted that a resist film 17B is provided on the Cr layer 17.

In the alignment mark 11A of FIG. 4B, on the other hand, an alignment mark pattern 12A having the same Cr/Cu/Cr structure is provided in correspondence to a marginal region of the glass substrate 11 where no rib pattern 14 is formed, simultaneously to the address electrodes 12 that have the same Cr/Cu/Cr structure. In FIG. 4B, it should be noted that the alignment mark pattern 12A is embedded in the thick dielectric layer 13 typically having a thickness of about 10 $\mu$m, and thus, the dielectric layer 13 has a substantially flat top surface also in the part covering the alignment mark pattern 12A. Thereby, the detection of the alignment mark pattern 12A by the CCD camera 28A or 28B is not possible as long as the camera 28A or 28B detects a reflection from the surface of the dielectric layer 13. In the construction of FIG. 4B, it should be noted that the dielectric layer 13 carries thereon a resist film 14A such that the resist film 14A covers the rib pattern 14.

Thus, in order achieve a proper alignment detection also for the alignment mark 11A of FIG. 4B, the alignment apparatus of FIG. 3 has a construction in which the stage 26 is formed with a depression 26A in correspondence to the alignment mark pattern 12A for accommodating an alignment optical source 26B, which may be an LED. When the substrate 11 is in a proper position on the stage 26, the alignment mark pattern 12A interrupts the output optical beam of the LED 26B, and the detection of the alignment becomes possible by detecting the state of the output optical beam of the LED 26B by the corresponding on of the CCD camera 28A and 28B. In other words, the alignment detection using the foregoing mark pattern 12A is achieved by the detection of a transmission optical beam, and thus, the mark pattern 12A is called transmission-type alignment mark. In FIG. 3, the LED 26B produces the output optical beam with a wavelength different from the wavelength of about 488 nm of the exposure optical beam 21A. For example, the LED 26B produces a red optical beam.

It should be noted that the alignment apparatus of FIG. 3 is actually the apparatus used for exposing printed circuit boards. In the case of exposing an opaque printed circuit board, a through hole 27A is provided as an alignment mark and the alignment detection is achieved by detecting the output optical beams of the LED 26B by the CCD cameras 28A and 28B.

Figure 5:
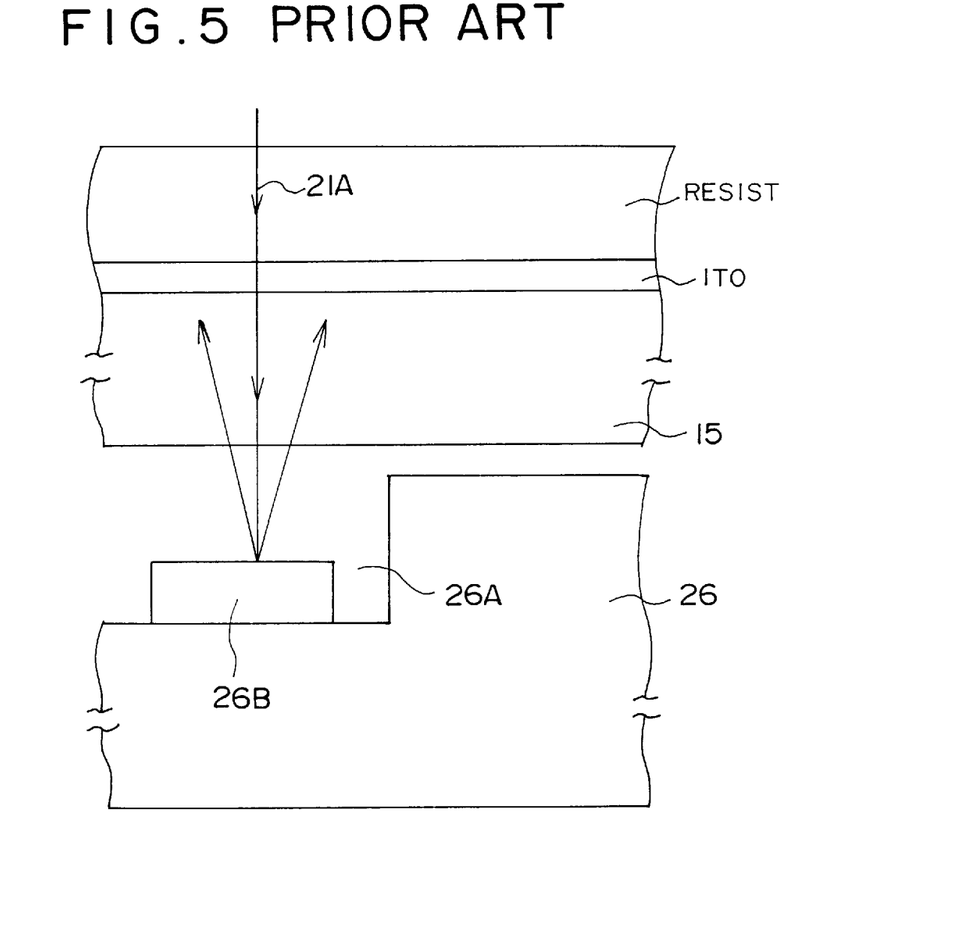
FIG. 5 is a diagram explaining the problem that occurs in an exposure process that uses an alignment mark.

FIG. 5 shows the process of forming the alignment mark pattern 16A on the substrate by using the exposure apparatus of FIGS. 2 and 3.

Referring to FIG. 5, the glass substrate 15 carrying thereon an ITO film from which the alignment mark pattern 16A is formed and a resist film for pattrning the ITO film, is placed on the stage 26 and the exposure laser beam 21A is applied according to the desired pattern of the alignment mark pattern 16A. The exposure laser beam 21A thus applied passes through the transparent ITO film as well through as the glass substrate 15 underneath and reaches the LED 26B provided on the depression 26A. Thereby, the exposure laser beam 21A is reflected by the surface of the LED 26B and causes an unwanted exposure of the resist film provided on the ITO film. As a result of such an excessive exposure of the resist film, the size of the alignment pattern 16A is modified unwantedly. Further, there may be an anomaly in the display electrode 16 formed simultaneously to the alignment mark pattern 16A from the ITO film.

Further, a similar problem may occur also when the stage 26 is formed with a depression 26C for accepting a robot hand which is used for transporting the substrate.

Figure 6:
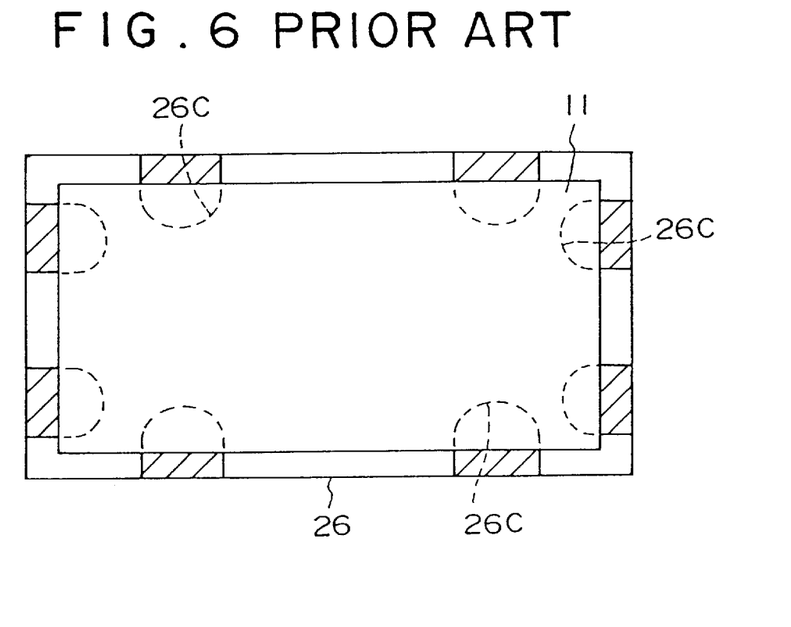
FIG. 6 is a diagram showing the construction of a stage of a conventional exposure system.

Referring to FIG. 6, it should be noted that the depressions 26C extend and reach the area of the substrate 15 held on the stage 26 on which the transparent electrode patterns are formed. Thus, the exposure laser beam 21A also causes, when reflected by the depressions 26C, an unwanted extraneous exposure in the resist pattern that is to be formed on the ITO film on the substrate 15 in correspondence to the display electrode 16. Thereby, the pattern of the display electrode 16 may also include a pattern anomaly.

In order to avoid the foregoing problem, it has been practiced to use a completely flat stage for the exposure of the substrate 15, and the alignment apparatus of FIG. 3 is used only for the exposure of the substrate 11. Even in such a case, however, the problem explained with reference to FIG. 6 cannot be avoided.

SUMMARY OF THE INVENTION

Accordingly, it is an object of the present invention to provide a novel and useful fabrication process of a flat-panel display device and an apparatus therefore wherein the problems described heretofore are eliminated.

Another and more specific object of the present invention is to provide a fabrication process of a high-resolution flat-panel display device and an apparatus therefore.

Another object of the present invention is to provide a fabrication process of a flat-panel display device comprising a transparent substrate, a transparent electrode pattern formed on said transparent substrate and an opaque electrode pattern formed on said transparent, said method comprising the steps of:

forming a transparent conductive film on said transparent substrate;

holding said transparent substrate on a flat principal surface of a stage, said stage including a depression formed on said flat principal surface, an optical source disposed in said depression, and a shutter movable in a plane substantially flush with said flat principal surface between a first state covering said depression and a second state exposing said depression;

forming said transparent electrode pattern and an alignment mark pattern on said transparent substrate by exposing and patterning said transparent conductive film, said step of exposing said transparent conductive film being conducted in a state that said shutter is in said first state;

forming an opaque conductive film on said transparent substrate so as to cover said transparent electrode pattern and said alignment mark pattern; and forming said opaque electrode pattern on said transparent electrode pattern while using a pattern formed in said opaque conductive film in correspondence to said alignment mark pattern as an alignment mark.

Another object of the present invention is to provide a fabrication process of a flat-panel display device comprising a transparent substrate, an opaque electrode pattern formed on said transparent electrode and another pattern formed on said opaque electrode pattern, said method comprising the steps of:

forming an opaque conductive film on said transparent substrate;

holding said transparent substrate on a flat principal surface of a stage, said stage including a depression formed on said flat principal surface, an optical source disposed in said depression, and a shutter movable in a plane substantially flush with said flat principal surface between a first state covering said depression and a second state exposing said depression;

forming said opaque electrode pattern and an alignment mark pattern on said transparent substrate by exposing and patterning said opaque conductive film;

forming another film on said transparent substrate so as to cover a region where said opaque electrode pattern is formed; and forming a pattern on said opaque electrode pattern by exposing and patterning said another film, said step of exposing said another film being conducted while using said alignment mark pattern as an alignment mark, said step of exposing said another film being conducted while setting said shutter to said second state.

Another object of the present invention is to provide a method of fabricating a flat-panel display device comprising a first transparent substrate, a transparent electrode pattern formed on said first transparent substrate, a first opaque electrode pattern formed on said transparent electrode pattern, a second transparent substrate, a second opaque electrode pattern formed on said second transparent substrate, and a rib pattern formed on said second opaque electrode pattern, said method comprising the steps of:

forming a transparent conductive film on said first transparent substrate;

holding said first transparent substrate on a flat principal surface of a stage, said stage including a depression formed on said flat principal surface, an optical source disposed in said depression, and a shutter movable in a plane substantially flush with said flat principal surface between a first state covering said depression and a second state exposing said depression;

forming said transparent electrode pattern and a first alignment mark pattern on said first transparent substrate by exposing and patterning said transparent conductive film, said step of exposing said transparent conductive film being conducted in a state that said shutter is in said first state;

forming a first opaque conductive film on said first transparent substrate so as to cover said transparent electrode pattern and said first alignment mark pattern;

forming said first opaque electrode pattern on said transparent electrode pattern by patterning said first opaque conductive film, said step of exposing said first opaque conductive film being conducted while using a pattern formed in said first opaque conductive film in correspondence to said first alignment mark pattern, as an alignment mark;

forming a second opaque conductive film on said second transparent substrate;

holding said transparent substrate on said flat principal surface of said stage;

forming said second opaque electrode pattern and a second alignment mark pattern on said second transparent substrate by exposing and patterning said second opaque conductive film;

forming an insulation film on said second transparent substrate so as to cover a region where said second opaque electrode pattern is formed; and forming said rib pattern on said second opaque electrode pattern by exposing and patterning said insulation film, said step of exposing said insulation film being conducted while using said second alignment mark pattern as an alignment mark, said step of exposing said insulation film being conducted while setting said shutter to said second state.

Another object of the present invention is to provide an exposure apparatus, comprising:

a stage having a substantially flat principal surface;

an alignment optical source disposed in a depression formed on said flat principal surface;

an exposure optical source for producing an exposing optical beam;

an exposing optical system for exposing a substrate held on said principal surface of said stage by said exposing optical beam; and a shutter provided on said stage movably in a plane substantially flush to said principal surface between a first position exposing said depression and a second position covering said depression.

According to the present invention, the problem of distortion of an exposure pattern, which occurs when forming a plurality of patterns on a transparent substrate by a multiple exposure process by a reflection from a stage used for holding the transparent substrate during the exposure, particularly from the depression formed in the stage for accommodating an alignment optical source, is successfully avoided, by providing a shutter on the stage such that the shutter is movable in a plane substantially flush to the principal surface of the stage between a first position covering the depression and a second position exposing the depression. The shutter is set to the first position when exposing a transparent pattern on the substrate and to the second position when conducting an alignment process that is conducted by using an opaque alignment pattern. It is particularly advantageous to provide an anti-reflection coating on the shutter and the stage principal surface such that the shutter and the stage principal surface have the same reflectance. When the shutter is not provided, it should be noted that the foregoing anti-reflection coating cannot be provided on the depression where the transmission-type alignment optical source is exposed.

The present invention is particularly useful for the fabrication of a flat-panel display device such as a plasma display panel in which a plurality of patterns are repeatedly exposed on a glass substrate.

Other objects and further features of the present invention will become apparent from the following detailed description when read in conjunction with the attached drawings.

DETAILED DESCRIPTION OF THE PREFERRED EMBODIMENT

Figure 7:
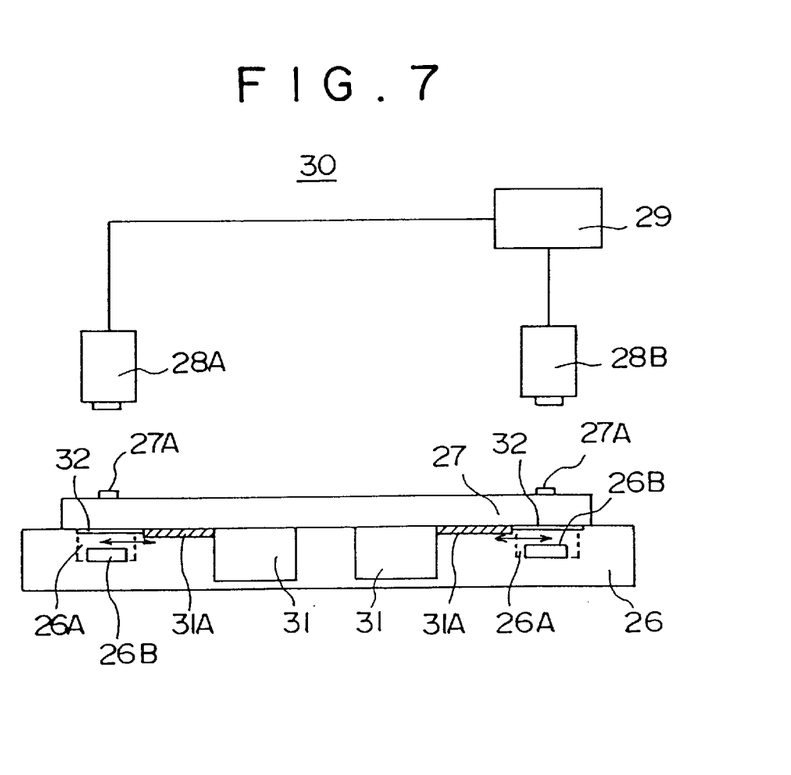
FIG. 7 is a diagram showing the construction of an exposure system according to a first embodiment of the present invention.

FIG. 7 shows the construction of an exposure apparatus 30 according to a first embodiment of the present invention, wherein those parts corresponding to the parts described previously are designated by the same reference numerals and the description thereof will be omitted.

Referring to FIG. 7, the stage 26 of the exposure apparatus 30 includes a movable shutter 32 provided so as to cover the depression 26A formed on the stage 26. The shutter 32 is movable between a first position covering the depression 26A and a second position exposing the depression 26A by a drive mechanism provided in the stage 26 such as a motor 31 and a screw rod 31A, wherein the shutter 32 is provided with an anti-reflection coating identical with the anti-reflection coating provided on the principal surface of the stage 26. Further, the motor 31 has a top surface substantially flush to the principal surface of the stage 26.

Figure 8:
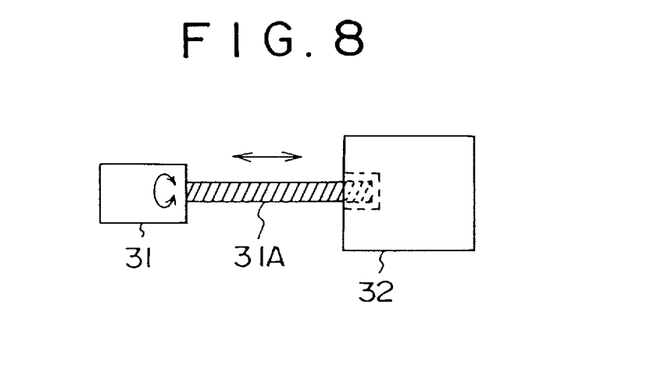
FIG. 8 is a diagram showing a part of the apparatus of FIG. 7.

FIG. 8 shows the motor 31 and the shutter 32 of FIG. 7 in detail.

Referring to FIG. 8, the motor 31 is connected to the shutter 32 by way of a screw rod 31A. Thus, the shutter 32 is moved in the direction of the arrow in response to the rotation of the motor 31.

FIGS. 9A–9D show the exposure process of the front glass substrate 15 conducted by using the exposure apparatus of FIG. 7.

Figure 9A:
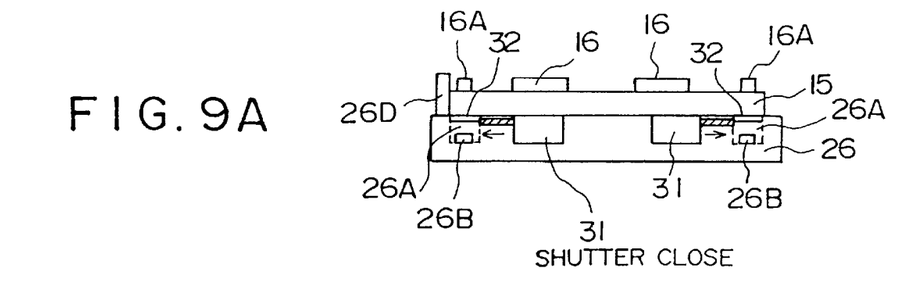
FIGS. 9A–9D are diagrams showing a part of the fabrication process of the front substrate of the plasma display panel conducted by the apparatus of FIG. 7.

Referring to FIG. 9A, the front substrate 15 is placed on the stage 26 such that the substrate 15 engages with a positioning pin 26D formed on the stage 26, and an ITO film (not shown) provided on the substrate 15 is subjected to an exposure and a patterning process that uses an acrylic resist film. As a result of the patterning process, the transparent display electrodes 16 are formed from the ITO film together with the ITO pattern 16A. The transparent display electrodes 16 and the ITO pattern 16A are typically formed with a thickness of about 0.2 $\mu$m.

In the step of FIG. 9A in which the transparent ITO film is patterned, the shutter 32 is set to the first position covering the foregoing depression 26A as indicated in FIG. 9A by the arrows, and the problem of size anomaly of the exposed pattern by the reflection of the exposure laser beam from the depression 26A is successfully avoided. In the foregoing exposure and patterning process of the ITO film, the development of the exposed resist film may be conducted by using $Na_2CO_3$, while the etching of the ITO film may be conducted by using an aqua regia.

Figure 9B:
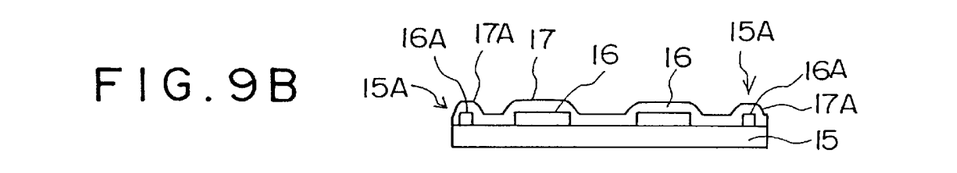

Next, in the step of FIG. 9B, the ITO pattern obtained in the step of FIG. 9A is covered uniformly by a conductive film 17 having the Cr/Cu/Cr structure explained before, uniformly with a thickness of about 2.2 $\mu$m. Thereby, the projection 17A is formed on the surface of the film 17 in correspondence to the ITO pattern 16A as already explained with reference to FIG. 4A. The projection 17A serves for the alignment mark 15A.

Figure 9C:
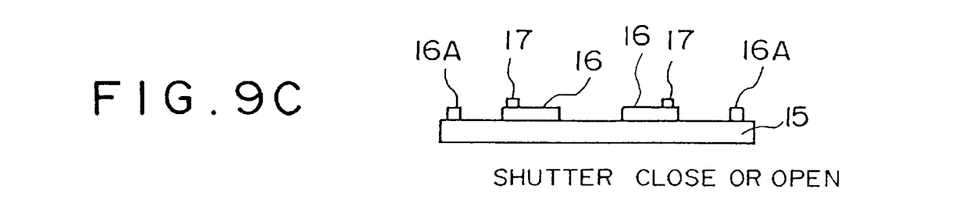

Next, in the step of FIG. 9C, a resist film is provided on the structure of FIG. 9B, followed by an alignment process conducted by using the reflection type alignment mark 15A formed in the step of FIG. 9B. After the alignment is thus achieved for the substrate 15, the conductive film 17 is patterned and the bus electrode 17 is formed as a result thereof. In the step of FIG. 9C in which the film 17 to be patterned is an opaque metal film, it should be noted that the exposure laser beam 21A is reflected by the conductive film 17 and the reflection from the stage 26 does not cause a problem. Thus, the process of FIG. 9C may be conducted by opening the shutter 32 or closing the shutter 32 as indicated in FIG. 9A. In the step of FIG. 9C, the patterning of the bus electrode 17 may be conducted by a photolithographic process in which the development of the exposed resist film is carried out by $Na_2CO_3$, followed by an etching of the conductive film 17 by using a resist pattern obtained as a result of the development of the exposed resist. The etching of the conductive film 17 may be carried out by using a mixture of HCl and $FeCl_3$ as an etchant.

Figure 9D:
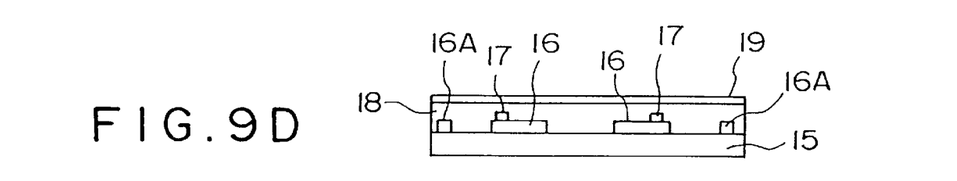

Further, in the step of FIG. 9D, the structure obtained in the step of FIG. 9C is covered consecutively by the insulation film 18 of a low melting glass and the protective film 19 of MgO.

Figure 10:
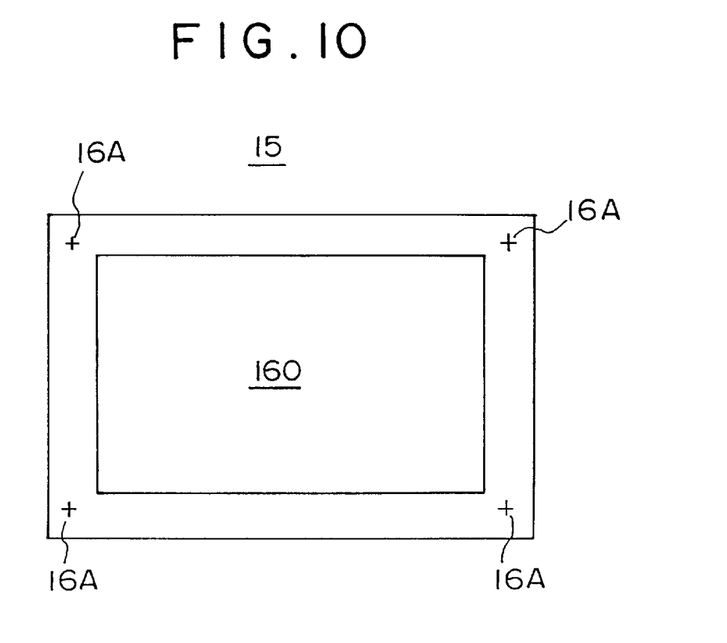
FIG. 10 is a diagram showing the front substrate formed by the process of FIGS. 9A–9D.

FIG. 10 shows the front glass substrate 15 obtained by the step of FIG. 9D, wherein the illustration of the transparent display electrodes 16 is omitted. Instead of showing the display electrodes 16, FIG. 10 shows a region 160 in which the display electrodes 16 are formed.

Referring to FIG. 10, it should be noted that the ITO pattern 16A is formed at the four corners of the glass substrate 15, while it should be noted that the location where the ITO pattern 16A is to be provided is by no means limited to the foregoing four corners of the glass substrate 15 but may be provided anywhere on the substrate 15 as long as the movable shutter mechanism can be formed on the stage 26 in correspondence thereto.

FIGS. 11A–11E show the process of forming a pattern on the rear glass substrate 11.

Figure 11A:
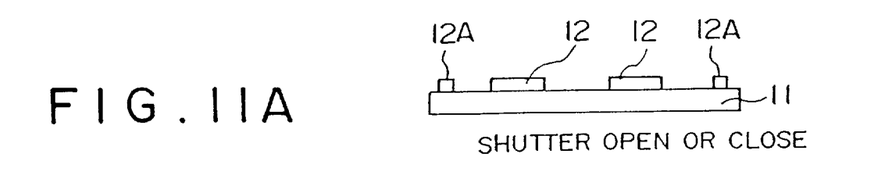
FIGS. 11A–11E are diagrams showing a part of the fabrication process of the rear substrate of the plasma display panel conducted by the apparatus of FIG. 7.

Referring to FIG. 11A, the glass substrate 11 carrying thereon a conductive film of the Cr/Cu/Cr structure (not shown) is placed on the foregoing stage 26 (not shown), and the conductive film is subjected to a photolithographic patterning process to form the address electrode patterns 12 as well as the alignment mark pattern 12A as a result of the photolithographic patterning of the conductive film. As the metal forming the conductive film 12 is opaque and has a high reflectance, no problem occurs when the shutter 32 in the stage 26 is opened or closed during the step of FIG. 11A. As a result of the step of FIG. 11A, the address electrodes 12 and the alignment marker 12A are formed with a thickness of about 1.5 $\mu$m.

Figure 11B:
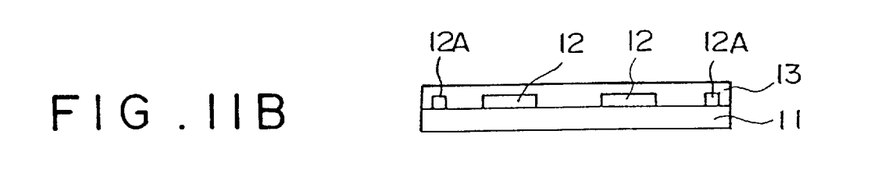
Figure 11C:
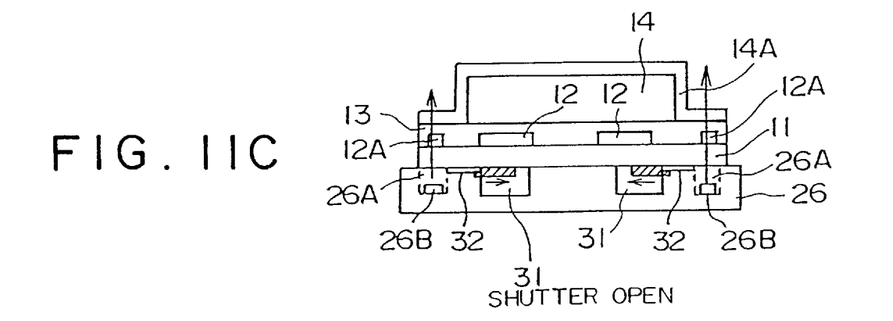

Next, in the step of FIG. 11B, the dielectric film 13 is deposited on the structure of FIG. 11A with a thickness of about 10 $\mu$m, followed by the step of FIG. 11C in which the formation of a rib layer 14 of a low melting glass is conducted further on the dielectric film 13 with a thickness of about 200 $\mu$m. In the step of FIG. 11C, it should be noted that a dry resist film 14A of an acrylic resin is provided on the rib layer 14. In the step of FIG. 11C, the dry resist film 14A is exposed and developed. The development of the dry resist film 14A may be conducted by using a solution of $Na_2CO_3$, similarly as before.

Figure 11D:
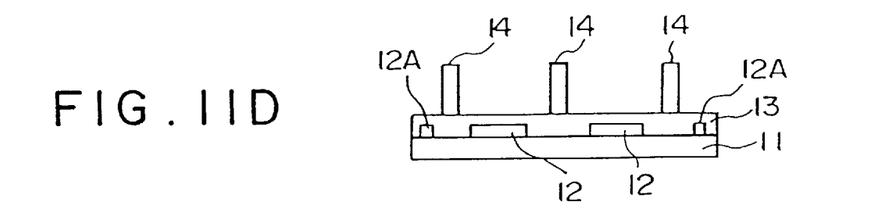
Figure 11E:
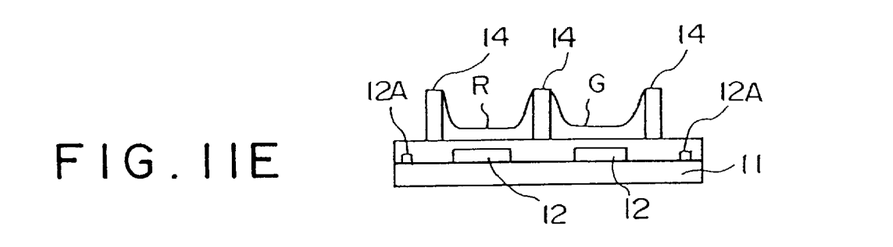

Next, in the step of FIG. 11D, the rib layer 14 is subjected to a sand-blasting process while using the dry resist film thus patterned as a mask, to form the rib patterns 14 from the rib layer 14 of FIG. 11C. Further, the step of FIG. 11E is conducted in which a fluorescent substance such as R, G or B is screen-printed between a pair of the rib patterns 14.

Figure 12:
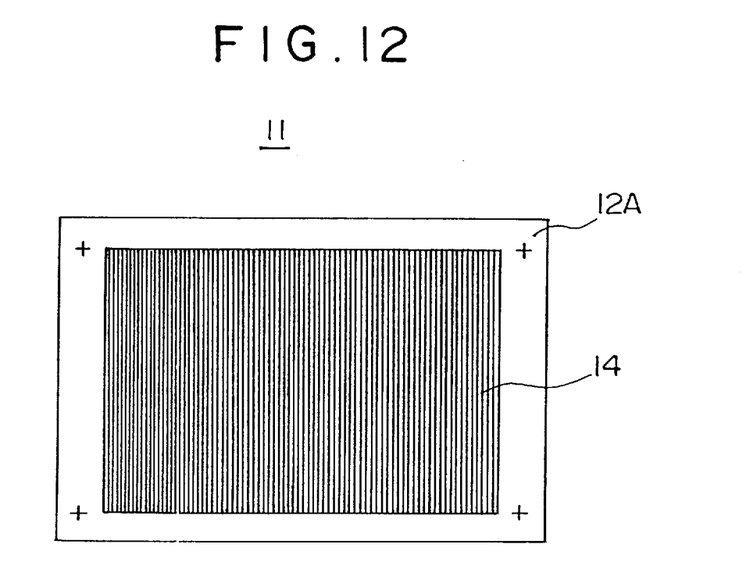
FIG. 12 is a diagram showing the rear substrate formed by the process of FIGS. 11A–11E.

FIG. 12 shows the glass substrate 11 thus formed.

Referring to FIG. 12, the glass substrate 11 carries the alignment marker pattern 12A at the four corners thereof, and the rib patterns 14 are formed in an inner region of the glass substrate 11. Further, the address electrode patterns 12 are formed underneath the rib patterns 14.

Figure 13:
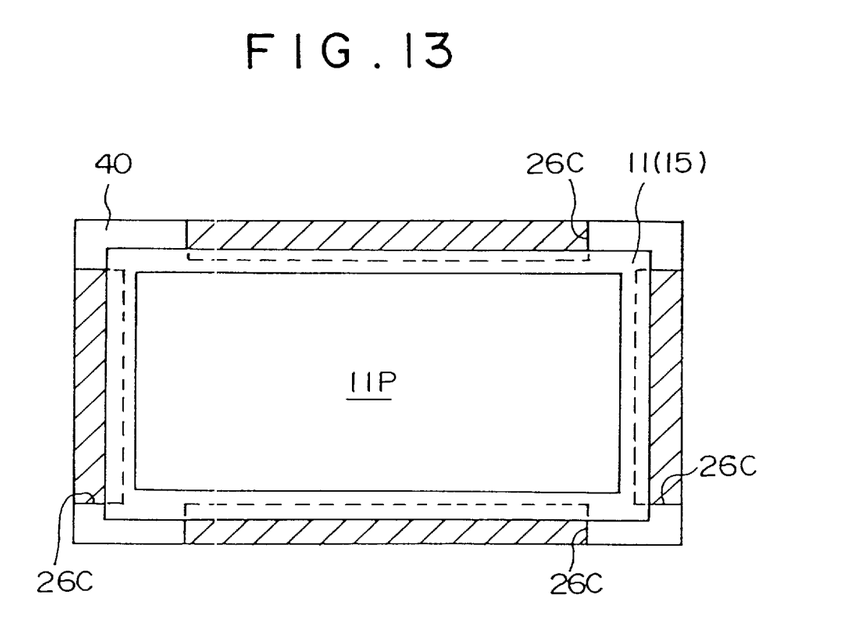
FIG. 13 is a diagram showing the construction of a stage according to a second embodiment of the present invention.

FIG. 13 shows the construction of a stage 40 according to a second embodiment of the present invention.

Referring to FIG. 13, the stage 26 is formed with the depressions 26C for accepting a transportation device such as a robot hand similarly to the conventional stage 26 of FIG.

6, wherein it should be noted that the depressions 26C of the stage 40 are formed only along the marginal part of the substrate 11 or 15 held on the stage 40 and do not reach the pattern region of the substrate. Thereby, the problem of distortion of the exposure pattern caused by the depressions 26C is successfully avoided by using the stage of FIG. 13 in the exposure process.

The construction of FIG. 13 is of course applicable to the exposure apparatus 30 of FIG. 7. Further, it is possible to provide a shutter covering the depression 26C similarly to the shutter 32

Further, the present invention is not limited to the embodiments described heretofore, but various variations and modifications may be made without departing from the scope of the invention.

What is claimed is:

1. A fabrication process of a flat-panel display device comprising a transparent substrate, a transparent electrode pattern formed on said transparent substrate and an opaque electrode pattern formed on said transparent electrode portion, said method comprising the steps of;

forming a transparent conductive film on said transparent substrate;

holding said transparent substrate on a flat principal surface of a stage, said stage including a depression formed on said flat principal surface, an optical source disposed in said depression, and a shutter movable relatively to said stage in a plane substantially flush with said flat principal surface thereof, between a first state covering said depression and a second state exposing said depression, the shutter having an exposed flat principal surface with a reflectance substantially the same as that of the flat principal surface of the stage;

forming said transparent electrode pattern and an alignment mark pattern on said transparent substrate by photolithographically patterning said transparent conductive film and with said shutter in said first state covering said depression;

forming an opaque conductive film on said transparent substrate so as to cover said transparent electrode pattern and said alignment mark pattern; and forming said opaque electrode pattern on said transparent electrode pattern using an exposure pattern for said opaque conductive film positioned in correspondence to said alignment mark pattern.

2. A fabrication process of a flat-panel display device comprising a transparent substrate, an opaque electrode pattern formed on said transparent electrode and another pattern formed on said opaque electrode pattern, said method comprising the steps of:

forming an opaque conductive film on said transparent substrate;

holding said transparent substrate on a flat principal surface of a state, said stage including a depression formed on said flat principal surface, an optical source disposed in said depression, and a shutter movable relatively to said stage in a plan substantially flush with said flat principal surface thereof, between a first state covering said depression and a second state exposing said depression, the shutter having an exposed flat principal surface with a reflectance substantially the same as that of the flat principal surface of the stage;

forming said opaque electrode pattern and an alignment mark pattern on said transparent substrate by photolithographically patterning said opaque conductive film;

forming another film on said transparent substrate so as to cover an area thereof where said opaque electrode pattern is formed; and forming an exposure pattern on said opaque electrode pattern by photolithographically patterning said another film while using said alignment mark pattern for alignment and with said shutter set to said second state exposing said depression.

3. A method as claimed in claim 2, wherein said another film is formed of an insulating material and said exposure pattern comprises a rib structure pattern.

4. A method of fabricating a flat-panel display device comprising a first transparent substrate, a transparent electrode pattern formed on said first transparent substrate, a first opaque electrode pattern formed on said transparent electrode pattern, a second transparent substrate, a second opaque electrode pattern formed on said second transparent substrate, and a rib pattern formed on said second opaque electrode pattern, said method comprising the steps of:

forming a transparent conductive film on said first transparent substrate;

holding said first transparent substrate on a flat principal surface of a stage, said stage including a depression formed on said flat principal surface, an optical source disposed in said depression, and a shutter movable relatively to said stage in a plane substantially flush with said flat principal surface thereof, between a first state covering said depression and a second state exposing said depression, the shutter having an exposed flat principal surface with a reflectance substantially the same as that of the flat principal surface of the stage;

forming said transparent electrode pattern and a first alignment mark pattern on said first transparent substrate by photolithographically patterning said transparent conductive film and with said shutter in said first state covering said depression;

forming a first opaque conductive film on said first transparent substrate so as to cover said transparent electrode pattern and said first alignment mark pattern;

forming said first opaque electrode pattern on said transparent electrode pattern using a pattern for said first opaque conductive film positioned in correspondence to said first alignment mark pattern;

removing said first transparent substrate with said transparent electrode pattern and said first alignment mark pattern thereon from said stage;

forming a second opaque conductive film on said second transparent substrate;

holding said second transparent substrate on said flat principal surface of said stage;

forming said second opaque electrode pattern and a second alignment mark pattern on said second transparent substrate by photolithographically patterning said second opaque conductive film;

forming an insulation film on said second transparent substrate so as to cover said second opaque electrode pattern; and forming said rib pattern on said second opaque electrode pattern by photolithographically patterning said insulation film while using said second alignment mark pattern for alignment and with said shutter set to said second state exposing said depression.

5. An exposure apparatus, comprising:

a stage having a substantially flat principal surface;

an alignment optical source disposed in a depression formed on said flat principal surface;

a shutter mounted on said stage and moveable relatively thereto in a plane substantially flush to said principal surface between a first position exposing said depression and a second position covering said depression, the shutter having an exposed flat principal surface with a reflectance substantially the same as that of the flat principal surface of the stage;

an exposure optical source producing an exposing optical beam; and an exposing optical system exposing a substrate held on said principal surface of said stage by said exposing optical beam.

6. An exposure apparatus as claimed in claim 5, wherein said respective principal surfaces of said stage and said shutter are each provided with an anti-reflection coating.

7. An exposure apparatus as claimed in claim 5, wherein said principal surface of said substrate has another depression thereon for accepting a part of a substrate transportation apparatus such that said depression extends along a contour of said substrate provided on said principal surface and such that said another depression does not reach an exposure region inside said substrate.

8. An exposure apparatus as claimed in claim 7, wherein said another depression is provided with another shutter movable relatively to the said stage between a first state covering said another depression and a second state exposing said another depression.

\* \* \* \* \*

UNITED STATES PATENT AND TRADEMARK OFFICE
CERTIFICATE OF CORRECTION

PATENT NO. : 5,876,884
DATED : March 2, 1999
INVENTOR(S) : Ryuji MAEDA et al.

It is certified that error appears in the above-identified patent and that said Letters Patent is hereby corrected as shown below:

On the title page, insert the foreign reference:

Japan          8-261756    October 2, 1996   --.

Col. 1,    line 22, change "1" to --11--.

Col. 3,    line 15, change "camera" to --cameras--.

Col. 9,    line 21, change ";" to --:--.

Signed and Sealed this

Seventh Day of December, 1999

Attest:

Q. TODD DICKINSON

Attesting Officer    Acting Commissioner of Patents and Trademarks